United States Patent
Shieh et al.

(10) Patent No.: US 6,362,092 B1
(45) Date of Patent: Mar. 26, 2002

(54) PLANARIZATION METHOD ON A DAMASCENE STRUCTURE

(75) Inventors: Ming-Shiou Shieh; Hsiao-Sheng Chin, both of Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/143,267

(22) Filed: Aug. 28, 1998

(30) Foreign Application Priority Data

Jun. 17, 1998  (TW) .......................................... 87109658

(51) Int. Cl.$^7$ .......................................... H01L 21/4763
(52) U.S. Cl. ........................ 438/631; 438/633; 438/672; 438/692
(58) Field of Search ................................ 438/618, 622, 438/631, 633, 637, 638, 672, 626, 692, 634, 645, 675

(56) References Cited

U.S. PATENT DOCUMENTS

| | | | | |
|---|---|---|---|---|
| 4,307,179 A | * | 12/1981 | Chang et al. | 430/314 |
| 4,617,193 A | * | 10/1986 | Wu | 438/631 |
| 5,187,119 A | * | 2/1993 | Cech et al. | 438/626 |
| 5,371,410 A | * | 12/1994 | Chen et al. | 257/750 |
| 5,423,939 A | * | 6/1995 | Bryant et al. | 216/18 |
| 5,665,202 A | * | 9/1997 | Subramanian | 438/692 |
| 6,037,664 A | * | 3/2000 | Zhao et al. | 257/758 |
| 6,103,625 A | * | 8/2000 | Marcyk et al. | 438/691 |

* cited by examiner

Primary Examiner—Carl Whitehead, Jr.
Assistant Examiner—Jamie L. Brophy

(57) ABSTRACT

A planarization method is used in a dual damascene structure. At the stage that a dual damascene structure is semi-formed on a semiconductor substrate but before a planarization process, the planarization method starts by forming a dielectric layer on a metal layer, which is to be polished. A portion of the dielectric layer other than the dual damascene structure is removed by etching. A CMP process is performed to planarize the substrate and exposes an inter-metal dielectric layer.

19 Claims, 4 Drawing Sheets

PLANARIZATION METHOD ON A DAMASCENE STRUCTURE

CROSS-REFERENCE TO RELATED APPLICATION

This application claims the priority benefit of Taiwan application serial no. 87109658, filed Jun. 17, 1998, the full disclosure of which is incorporated herein by reference.

BACKGROUND OF THE INVENTION

1. Field of the Invention

This invention relates to formation of a damascene structure in semiconductor fabrication process, and more particularly to a planarization method included in fabricating a dual damascene structure to reduce dishing and oxide erosion phenomena.

2. Description of Related Art

A highly integrated semiconductor device usually includes at least two interconnect metal layers, called multilevel interconnects. Its purpose is to accord with a wiring line structure, which is a three-dimensional interconnection design to increase integration of devices. Fabrication of the multilevel interconnects usually includes a first interconnect metal layer on the lower level and a second interconnect metal layer on the upper level. These two interconnect metal layers carry their own interconnection structures and are electrically coupled together in a certain location. The first interconnect metal layer includes, for example, polysilicon or metallic material and is directly and electrically coupled to an interchangeable source/drain region of transistors on a semiconductor substrate. The other interconnections between device elements are accomplished by the second interconnect metal layer or more interconnect metal layers.

As the device dimension is reduced down to the deep-submicron level, problems may develop for the interconnection method described above. For example, if a plug to fill an opening is made of copper, then it induces a lot of problems when the copper plug is etched back, and it is difficult to choose a proper etchant. Moreover, the fabrication becomes more difficult. For example, a void or a trapping of impurities can occur due to a poor quality of step coverage when the metal layer is deposited into the plug or a dielectric layer is deposited over the metal layer. A conventional method called damascene is then proposed to solve above problems induced by a reduced device dimension at deep-submicron level and to automatically planarize the dielectric layer.

Currently, damascene technology, such as dual damascene technology, is widely used to fabricate interconnect metal layers. This dual damascene technology allows the fabrication of an integrated circuit device to be more stable and more advanced. A variety of metallic materials, such as aluminum, copper, or aluminum alloy, can be chosen. Therefore, the requirements of low resistance and low electro-migration for interconnect metal layer are easily satisfied by allowing various choices of metallic materials. The dual damascene technology is thereby widely used in very large scale integrated (VLSI) fabrication at a dimension less than 0.25 microns to fabricate an interconnect structure with high efficiency and high stability.

However, for the conventional dual damascene structure, when a large area is planarized by CMP process, a dishing phenomenon then occurs. Furthermore, an oxide erosion may occur on the high element density region to cause an electrical property shift.

FIGS. 1A–1D are cross-sectional views schematically illustrating a conventional dual damascene process flow. The dual damascene structure is one example of damascene structure and is taken as an example for disclosure. In FIG. 1A, an inter-metal dielectric layer 12 including, for example, oxide is formed over a semiconductor substrate 10. Then, a wide opening 14 is formed on the inter-metal dielectric layer 12 by photolithography and etching.

In FIG. 1B, a narrow opening 16 is formed in the inter-metal dielectric layer 12 within the wide opening 14 by photolithography and etching. The narrow opening 16 exposes the substrate 10 and has a narrower width than the width of the wide opening 14.

In FIG. 1B and FIG. 1C, a metal layer 18 is deposited over the substrate 10 so that the openings 14, 16 are fully filled. The wide opening 14 has a larger width and thereby the photolithography resolution is not limited but causes a concave region 17 above the wide opening 14.

In FIG. 1C and FIG. 1D, a CMP process is performed to polish the metal layer 18 until the inter-metal dielectric layer 12 is exposed. The surface of the structure is also planarized. The top portion of the metal layer 18 is polished away and only the portion within the opening 14 is left. Since the concave region 17 exists originally, a little concave region 19 still exists after CMP process. The concave region 19 is called the dishing phenomenon.

The dishing phenomenon occurs when a CMP process is performed on the dual damascene structure. If the substrate includes a large number of the dual damascene structures, another phenomenon may further occur. FIG. 2 is a cross-sectional view schematically illustrating several dual damascene structures formed on a semiconductor substrate after CMP process. In FIG. 2, several dual damascene structures 24 are formed on an inter-metal dielectric layer 22, which is formed over a semiconductor substrate 20. After CMP process, the inter-metal layer 22 has lower surface height at the central region and each of the dual damascene structures 24 has concave surface as usual but those dual damascene structures 24 at the central region also have lower surface height. This phenomenon is called the oxide erosion phenomenon.

Since planarization is still poor for the dual damascene structure after CMP process, it thereby affects the subsequent fabrication processes and further causes an electrical property shift. For example, if the surface height is not uniform, a pattern can not be precisely transferred onto a subsequent layer such as a next interconnect metal layer serving as an interconnect metal line or any kind of layers to be patterned.

SUMMARY OF THE INVENTION

It is therefore an objective of the present invention to provide a planarization method for a damascene structure in order to reduce the dishing and erosion phenomena so that the subsequent fabrication processes are not affected.

In accordance with the foregoing and other objectives of the present invention, a planarization method is included in fabrication of a damascene structure on a semiconductor substrate. The planarization method is performed after a dual damascene structure is semi-formed on a semiconductor substrate but before a CMP process is performed to polish a metal layer on the top of the substrate for planarization. The planarization method therefore starts by forming a dielectric layer over the metal layer. Next, a portion of the dielectric layer other than the dual damascene region is removed. Based on a polishing rate ratio of the dielectric layer to the metal layer, a CMP process is performed to planarize the substrate and exposes an inter-metal dielectric layer included in the dual damascene structure. The dual damascene structure is accomplished and the surface of the substrate is simultaneously planarized with a sufficiently good quality, in which the dishing and erosion phenomena are avoided.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
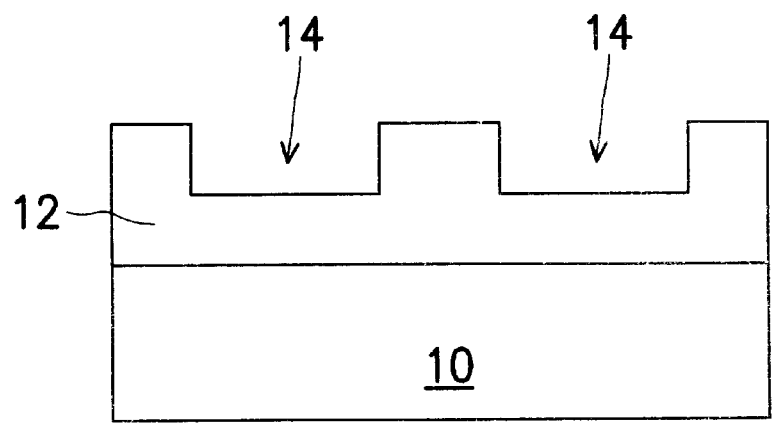
FIGS. 1A–1D are cross-sectional views schematically illustrating a conventional dual damascene process flow.
Figure 1B:
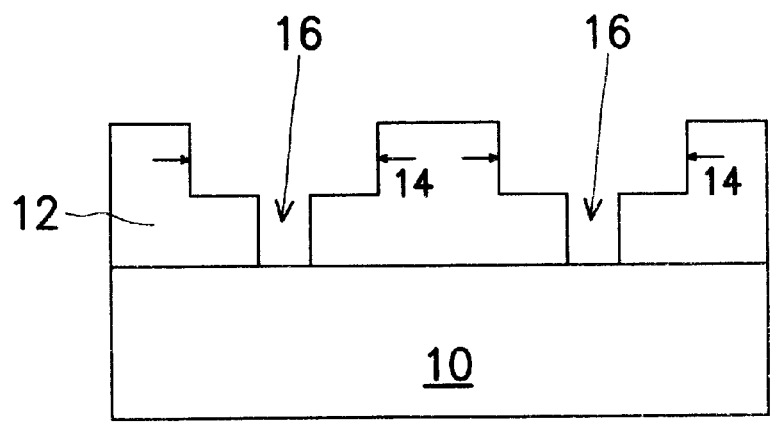
Figure 1C:
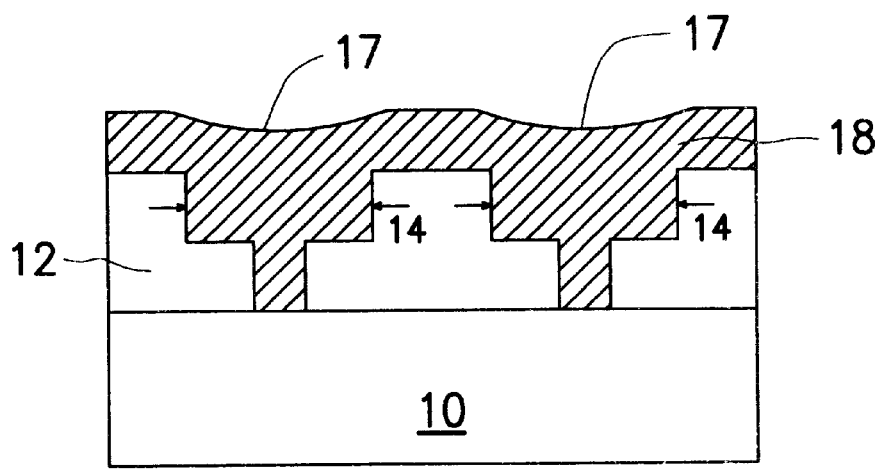
Figure 1D:
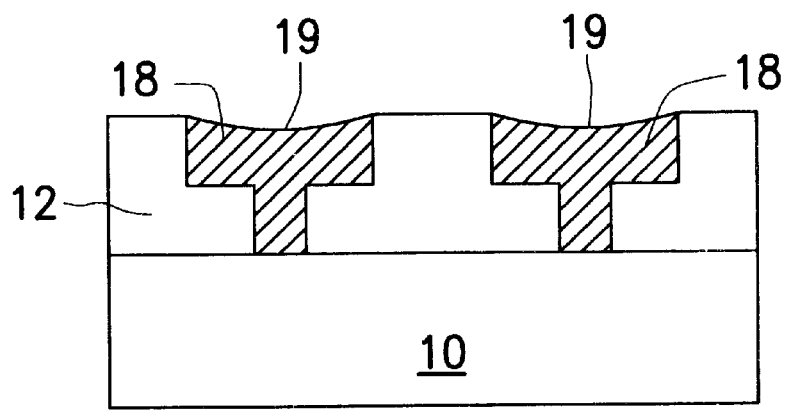
Figure 2:
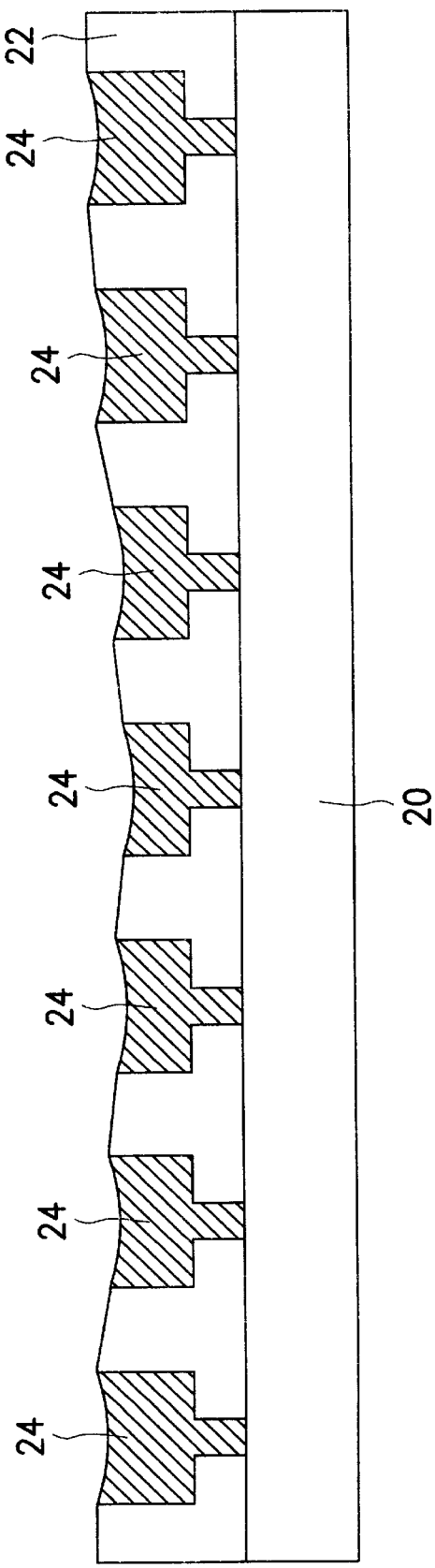
FIG. 2 is a cross-sectional view schematically illustrating several dual damascene structures formed on a semiconductor substrate after CMP process.

The first few steps of a method, according to a preferred embodiment of the invention, to form a dual damascene structure on a semiconductor are the same as those steps shown in FIGS. 1A–1C.

Figure 3A:
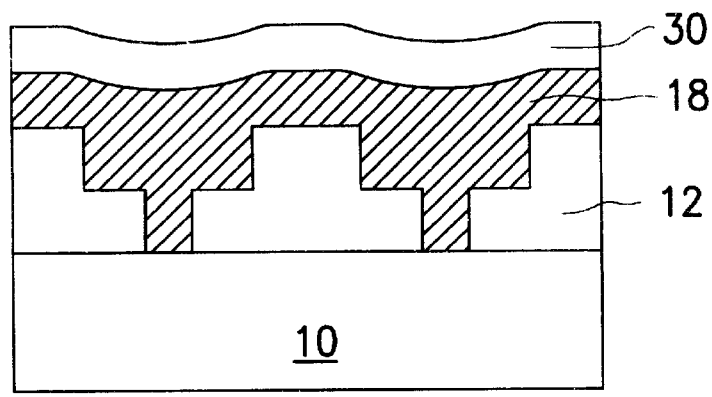
FIGS. 3A–3C are cross-sectional views schematically illustrating a planarization process flow for a damascene structure, according to a preferred embodiment of the invention.
Figure 3B:
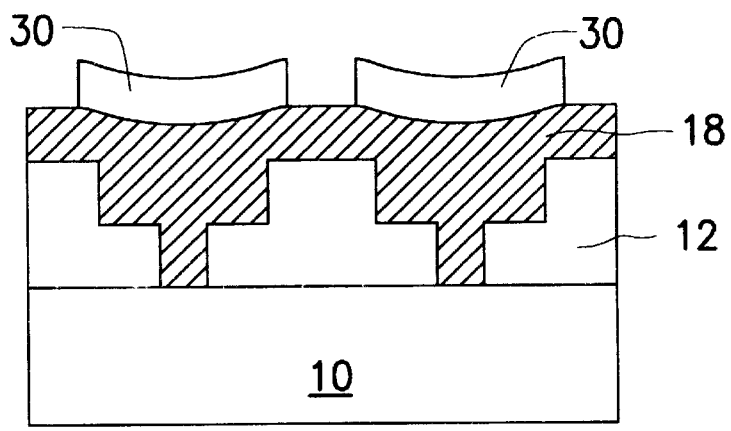
Figure 3C:
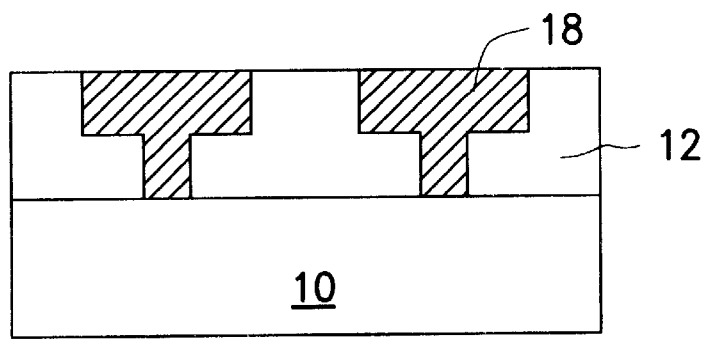

The subsequent processes to be described below are about a planarization method of the invention. FIGS. 3A–3C are cross-sectional views schematically illustrating a planarization process flow for a damascene structure, according to a preferred embodiment of the invention. A like reference number represents a like object.

In FIG. 3A, the metal layer 18 can also be formed by, for example, by electroplating or non-electroplating. A dielectric layer 30 is formed over the metal layer 18 by, for example, blanket deposition or coating. In FIG. 3B, a portion of the dielectric layer 30 above the dual damascene structure region is maintained, while a portion other than the dual damascene structure region is removed by, for example, etching. In FIG. 3C, by making use of a polishing rate ratio of the dielectric layer 30 to the metal layer 18, a CMP process is, for example, performed to planarize the substrate 10. The inter-metal dielectric layer 12 is thereby exposed. The residual metal layer 18 is the accomplished damascene structure on the substrate 10. Since the dielectric layer 30 shown in FIG. 3B compensates for the concave region, planarization has a sufficiently good quality. The dishing and erosion phenomena are reduced. The damascene structure shown in the embodiment is a dual damascene structure only for the purpose of an example. The planarization method of the invention is suitable for any similar damascene structure having dishing or erosion phenomena.

In conclusion, the dielectric layer 30 above the dual damascene structure is used in a CMP process. Since it provides a better polishing rate ratio of the dielectric layer 30 to the metal layer 18, the quality of planarization is sufficiently good to avoid the dishing and erosion phenomena.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A planarization method for a damascene structure, the method comprising:

forming a first dielectric layer over a semiconductor substrate;

forming a first opening in the first dielectric layer;

forming a metal layer over the substrate to fill the first opening;

forming a second dielectric layer directly on the metal layer;

removing a portion of the second dielectric layer other than a region above the first opening by etching; and performing a chemical mechanical polishing (CMPU process to remove remaining portions of the second dielectric layer and a portion of the metal layer until the first dielectric layer is exposed.

2. The method of claim 1, wherein the first dielectric layer comprises oxide.

3. The method of claim 1, wherein the step of forming the first opening comprises photolithography and etching.

4. The method of claim 1, wherein after the first opening is formed, the method further comprises a process to form a second opening within the first opening, in which the subsequent metal layer also fills the second opening.

5. The method of claim 4, wherein a width of the second opening is narrower than a width of the first opening.

6. The method of claim 1, wherein the step of forming the metal layer comprises a deposition process.

7. The method of claim 1, wherein the step of forming the metal layer comprises an electroplating process.

8. The method of claim 1, wherein the step of forming the second dielectric layer comprises a deposition process.

9. The method of claim 1, wherein the step of forming the second dielectric layer comprises a coating process.

10. The method of claim 1, wherein the step of removing a portion of the second dielectric layer comprises photolithography and etching.

11. The method of claim 1, wherein the step of performing a CMP process comprises use of a polishing rate ratio of the second dielectric layer to the metal layer.

12. A planarization method for a damascene structure, applicable to a semiconductor substrate, on which forms a first dielectric layer with a damascene structure opening therein, the method comprising:

forming a metal layer over the substrate to fill the damascene structure opening;

forming a second dielectric layer on the metal layer;

removing a portion of the second dielectric layer by etching so that remaining portions of the second dielectric layer directly align with the damascene structure opening; and performing a CMP process to remove the patterned second dielectric layer and a portion of the metal layer outside the damascene structure opening.

13. The method of claim 12, wherein the first dielectric layer comprises oxide.

14. The method of claim 12, wherein the damascene structure comprises a dual damascene structure.

15. The method of claim 12, wherein the step of forming the metal layer comprises a deposition process.

16. The method of claim 12, wherein the step of removing a portion of the second dielectric layer comprises photolithography and etching.

17. The method of claim 12, wherein the step of performing a CMP process comprises use of a polishing rate ratio of the second dielectric layer to the metal layer.

18. A planarization method for dual damascene structures formed on a substrate having a first dielectric layer thereon, the method comprising:

forming dual damascene openings in the first dielectric layer for exposing the substrate;

forming a metal layer on the first dielectric layer for filling the dual damascene openings;

forming a patterned second dielectric layer on the metal layer, wherein the patterned second dielectric layer is formed by removing a portion of a second dielectric layer by photolithography and etching, so that the patterned second dielectric layer aligns above the dual damascene openings; and performing a chemical mechanical polishing process for removing the patterned second dielectric layer and a portion of the metal layer outside the damascene openings until the first dielectric layer is exposed.

19. The method of claim 18, wherein the step of performing the chemical mechanical polishing process uses a polishing rate ratio of the second dielectric layer to the metal layer.

\* \* \* \* \*